United States Patent [19]

Loucks

[11] Patent Number: 4,823,020

[45] Date of Patent: Apr. 18, 1989

[54] HIGH VOLTAGE PULSE TOP CLIPPER WITH PRECISE REGULATION OF CLIPPING LEVEL

[75] Inventor: Richard S. Loucks, Northridge, Calif.

[73] Assignee: ITT Gilfillan, Van Nuys, Calif.

[21] Appl. No.: 133,461

[22] Filed: Dec. 15, 1987

[51] Int. Cl.$^4$ ............................................. H02M 7/00
[52] U.S. Cl. ................................... 307/106; 307/107; 307/265; 307/546; 328/162; 363/59
[58] Field of Search ............... 307/106, 107, 108, 109, 307/110, 265, 266, 267, 268, 228, 358, 542, 555, 544, 540, 546, 551, 553; 455/24, 50, 161, 213, 210, 222; 375/24, 25, 26, 41; 358/242, 155, 148, 183, 37, 105, 108, 177, 167, 166, 336; 328/115, 163, 165, 169, 164, 162, 54, 59; 332/15; 330/263, 255, 267, 297

[56] References Cited

U.S. PATENT DOCUMENTS

| | | | |
|---|---|---|---|
| 3,173,095 | 3/1965 | Wagner | 307/546 X |
| 3,286,106 | 11/1966 | Deveson | 307/544 X |
| 4,071,781 | 1/1978 | Kayalioglu | 307/265 |
| 4,149,231 | 4/1979 | Bukosky et al. | 363/59 |
| 4,250,408 | 2/1981 | Spence | 307/542 |
| 4,271,535 | 6/1981 | Fukuhara et al. | 328/162 X |

Primary Examiner—William M. Shoop, Jr.
Assistant Examiner—Paul Ip
Attorney, Agent, or Firm—Robert A. Walsh; Thomas N. Twomey; Mary C. Werner

[57] ABSTRACT

A high voltage pulse clipper for stabilizing the amplitude of successive pulses applied, for example, as modulator pulses to a microwave transmitter. A source of such pulses has its output connected across a capacitor through a series diode whereby the capacitor charge acts as a back bias for the diode. The ground potential side of the capacitor includes a circuit which adds a voltage in opposition to that extant across the capacitor to equalize the capacitor error voltage resulting from variations of the input pulse amplitude and pulse spacing.

14 Claims, 2 Drawing Sheets

4,823,020

HIGH VOLTAGE PULSE TOP CLIPPER WITH PRECISE REGULATION OF CLIPPING LEVEL

BACKGROUND OF THE INVENTION

1. Field of the Invention

The invention relates generally to amplitude regulation of high voltage pulses and more specifically to pulse-top clippers for microwave transmitter-modulator pulses.

2. Description of the Prior Art

Amplitude regulation or stabilization of pulses, including high voltage pulses, such as are associated with pulsed radar transmitter-modulators, has been accomplished in the prior art by various means. Series or shunt regulators are unattractive because of the high voltage components required and because of the power loss resulting. Moreover, it is very difficult to measure the pulse amplitude error (variation) because it is a small value out of a very large pulse amplitude. In one such radar pulse modulator the pulse amplitude was 34,000 volts and the short term amplitude repeatability requirement was ±1 volt RMS. That order of pulse stability was required because the output frequency of the pulsed microwave generator (transmitter) varies as some function of pulse voltage. Modern radar systems employing high performance MTI (moving target indicator) signal processing cannot tolerate any substantial short term frequency variation of the transmitter from pulse-to-pulse (short term).

A relatively simple pulse clipper capable of substantial regulation by pulse clipping includes a capacitor connected to the pulse generator terminals through a diode. The charge accumulated by the capacitor acts as a back bias on the diode. Accordingly, an increase of the input pulse amplitude causes an increase in this back bias and a corresponding clipping action applied to the pulse. The clipped pulse output appears across the capacitor and a bleeder resistor is paralleled with it, the value of the capacitor being small enough so as not to otherwise substantially affect the high voltage pulse shape.

The aforementioned pulse clipper is adversely affected by changes in the interpulse period intentionally programmed into some radar systems. The back bias of the clipping diode obviously also changes in an undesired manner as the interpulse period changes, primarily because of the bleeder, thus diminishing the effectiveness of the clipping action.

SUMMARY OF THE INVENTION

In consideration of the disadvantages of prior art high voltage pulse clipping circuits, it may be said to have been the general object of the invention to develop a novel auxiliary circuit for incorporation or retrofitting into a prior art clipper circuit for greatly improved stability of the clipping level. The novel combination is simple, inexpensive and constructed with low power, low voltage components. The same diode and capacitor configuration identified as prior art is the starting point for the invention. An additional second capacitor is inserted in series with the ground lead of the first capacitor forming a capacitive voltage divider. The pulse voltage across this second capacitor is amplified in a differential amplifier and the output of that amplifier is fed back to the ground terminal end of the voltage divider thereby forming a virtual ground at that point when no pulse voltage is extant across the second capacitor but pulse voltage across it is amplified and inverted to form an inverse "bootstrap" signal which is fed to the end terminal of the divider. This has the effect of modifying the diode back bias for clipping action, but without the disadvantages of the prior art clipping circuit described hereinbefore.

The details of a typical circuit for the purpose and according to the invention will be described hereinafter.

DETAILED DESCRIPTION

Figure 1:
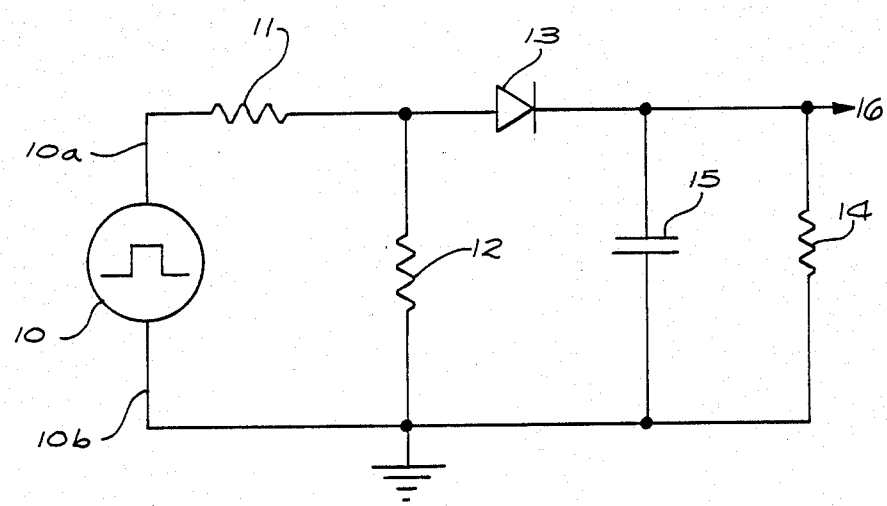
FIG. 1 illustrates the circuit of a prior art pulse clipper of the type to which the combination of the invention applies.
Figure 2:
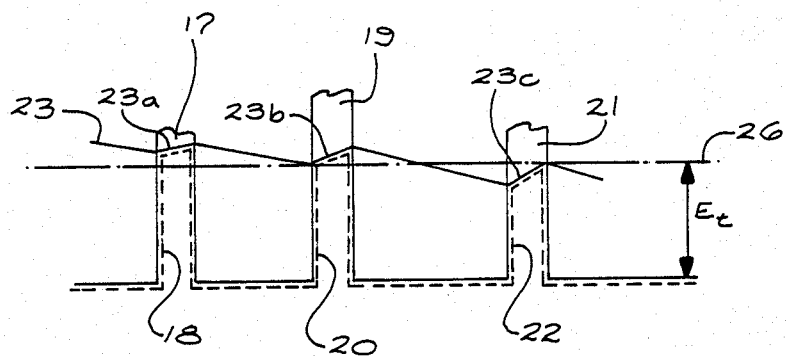
FIG. 2 presents operational waveforms for the circuit of FIG. 1 to facilitate the description.

Referring now to FIGS. 1 and 2, the prior pulse clipper circuit will first be described in order that the prior art deficiencies can be more fully understood and the improvement provided by the combination of FIG. 3 can be appreciated as it is subsequently described.

In FIG. 1, the pulse generator 10 is of well-known form, and would normally include an internal pulse transformer (not shown). The terminals 10a and 10b would then be the secondary (output) terminals of such a transformer.

The resistor 11 represents the internal impedance (substantially resistive) of the pulse generator 10, which is matched by the load resistor 12. In one practical implementation, the internal impedance 11 was on the order of 3600 ohms and accordingly, resistor 12 was set at that value.

The diode 13 is of known type, selected for the pulse voltage level encountered. However, the high voltage level of the pulses to be clipped notwithstanding, the actual voltage drop across diode 13 is not extraordinary high, since during the pulse times, the diode conducts once the back-bias level is exceeded. This back bias is that voltage resulting from charging of capacitor 15 during that conduction. The capacitance value of capacitor 15, consistent with the other circuit parameters indicated was 0.25 microfarads. The clipped pulse output terminal to the pulsed radar transmitter on other utilization device is identified at 16 on FIG. 1. Bleeder resistor 14 is intended as a safety and pulse-to-pulse reset means in respect to the charge on capacitor 15. For a nominal 34,000 volt pulse out of pulse generator (radar pulse modulator) 10 and the other parameters indicated, a value of 4.0 megohms for bleeder 14 is appropriate.

Referring now to FIG. 2, a train of pulses 17, 19 and 21 from pulse generator 10 is illustrated with variable pulse spacing, as in a staggered or agile pulse repetition interval system. As can be seen from FIG. 2, the raw pulse train (17, 19 and 21) typically has voltage ripple and variable amplitude. The clipped pulse train, in extant at terminal 16 on FIG. 1, is shown at 18, 20 and 22 on FIG. 2. The back bias for diode 13 is represented by line 23 on FIG. 2, portions 23a, 23b and 23c showing the dynamic change of diode 13 bias during the charge of capacitor 15 for the duration of each pulse. Between pulses, the level of bias 23 declines because of discharge of capacitor 15. Obviously that decline is greater between pulses 19 and 21 than it is between pulses 17 and 19 in view of the corresponding interpulse interval differences.

FIG. 2 is exaggerated for clear illustration in respect to amplitude differences between successive raw pulses as a percentage of the typical nominal raw pulse amplitude of 34,000 volts. Similarly, the changes in diode 13 dynamic bias along line 23 on FIG. 2 are exaggerated for clarity.

The target output level of the clipped pulse train 18, 20 and 22 is represented at 26 on FIG. 2, this value being also identified as $E_t$ (extant at output terminal 16 on FIG. 1)

Figure 3:
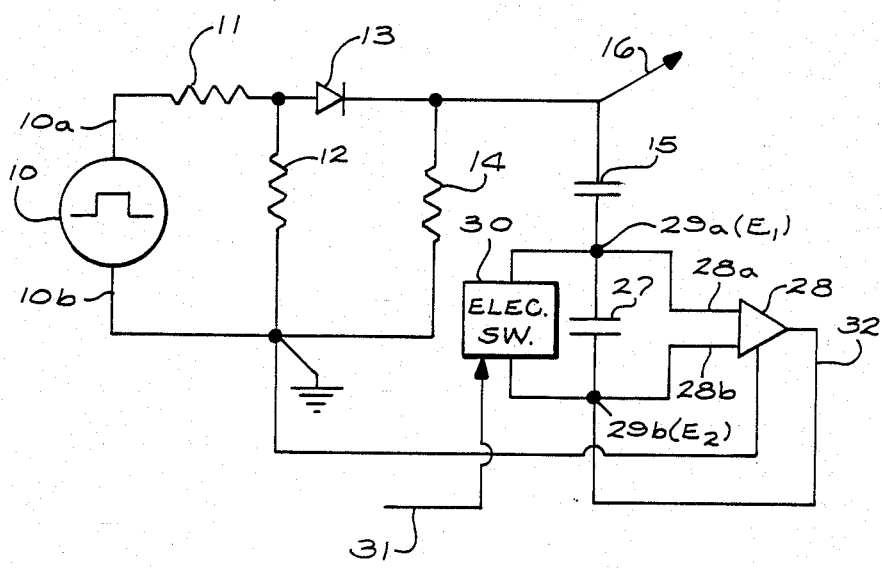
FIG. 3 illustrates a typical circuit incorporating the concepts of the invention.

Referring now to FIG. 3, a typical circuit arrangement incorporating the concepts of the invention is shown. The elements of FIG. 1 are repeated, including 10, 11, 12, 13, 14 and 15, and their functions are substantially as indicated in connection with FIG. 1, but additional elements are included in the novel combination.

Rather than returning to ground as in FIG. 1, capacitor 15 connects to a second capacitor 27. That capacitor 27 returns to point 29 which is connected to the output of differential amplifier 28 having differential inputs 28a and 28b and an output 32. Capacitor 27 has a value of ten times that of capacitor 15, i.e. 2.5 microfarads vis-a-vis 0.25 microfarads for capacitor 15. Capacitors 15 and 27 become a capacitance divider having a division ratio of approximately one ninth.

Sensing of the scaled voltage value across capacitor 27 is effected by connecting the differential inputs 28a and 28b across points 29a and 29b as indicated in FIG. 3. Amplifier 28 provides a gain of approximately nine such that it can control point 29b inversely and with a scale factor compensatory of the capacitive divider factor.

Figure 4:
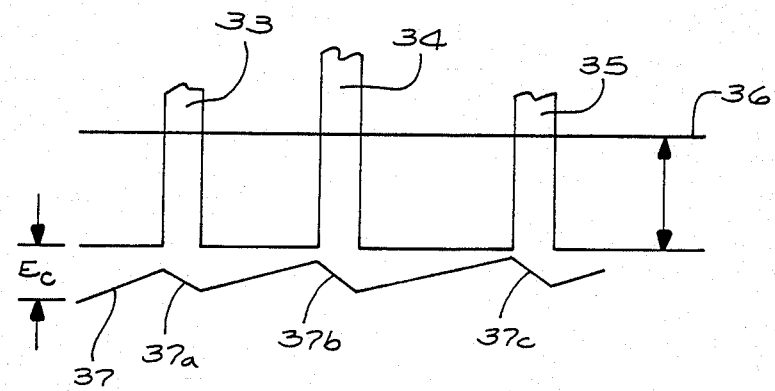
FIG. 4 presents operational waveforms for the circuit of FIG. 3 to facilitate description thereof.

In FIG. 4 three raw pulses 33, 34 and 35 are shown similar to pulses 17, 19 and 21 of FIG. 2. The desired or target $E_t$ (amplitude of output pulses at 16 of FIG. 3) is drawn as line 36 on FIG. 4. In view of the inversion of signal at output 32 of amplifier 28, the diode 13 dynamic bias level is represented at 37 on FIG. 4. It will be noted that the control or dynamic compensating level will look much like line 37 on FIG. 4, with downward slopes at 37a, 37b and 37c and upward slopes during the interpulse periods. The effect of this is to dynamically compensate for the prior art bleeder loss discussed in connection with FIG. 1, and to improve the clipping action produced. It may be said that this clip threshold control voltage $E_c$ (line 37 on FIG. 4) is algebraically added to the primary clip threshold voltage across capacitor 15.

Referring now to switch 30, which is actually a solid state electronically controlled open/close element, it will be noted that the circuit of FIG. 3 operates identically to that of FIG. 1 when switch 30 is closed, since the voltage between points 29a and 29b cannot be other than zero at that time. Switch 30 is controllable in accordance with a conventional timing signal at switch control input 31. The purpose of such a switch will now be developed.

When switch 30 is open the current flowing in capacitor 15 also flows in capacitor 27. A change of charge thereby caused in capacitor 15 is reflected as a change of charge in capacitor 27, and if switch 30 remains open the integrating effect of capacitor 27 eventually results in a build-up of voltage beyond the ratings of the component elements associated therewith. Since the circuit of FIG. 4 is intended to compensate short term charges to enhance radar modulator pulse uniformity for the sake of MTI system performance, short term on (over a few pulses) stability is of prime importance. An option for preventing the build-up of capacitor 27 voltage when an application requires precise control of bursts of pulses involves timing of switch 30 to remain closed until just before the first pulse of burst and closing it after the last pulse of the burst. It is also possible to place a bleeder resistor across capacitor 27. Such a bleeder for capacitor 27 would be sized to hold the charge on capacitor 27 long enough to maintain regulation but allow discharge to zero over the long term.

It will be realized that the combination according to the invention permits control of both pulse-top ripple and absolute pulse amplitude stability over the short term.

Modifications and variations will suggest themselves to those of skill in this art once the novel concepts are appreciated. Accordingly, it is not intended that the scope of the invention be regarded as limited by the drawings or this description, these being illustrative only.

Although the description and drawings infer a particular polarity of the high voltage pulse, it will be realized that reversal of diode 13 polarity and a few other accommodations in the circuitry readily effected by a person of skill in this art would make the combination operable with a high voltage pulse of the opposite polarity.

Still further, while high voltage pulse clipping has been a specific objective of the invention, there is no reason why the concepts and apparatus described could not be applied to pulse trains of moderate peak voltages.

I claim:

1. A pulse clipping circuit operative with a source of a train of pulses, for regulating said pulses to a predetermined uniform amplitude, comprising:
    first and second capacitors in series forming a capacitive divider, said second capacitor having a lead:
    a diode forward poled with respect to the polarity of said pulses and connected between said source and said first capacitor;
    and compensating means for sensing the voltage across said second capacitor for developing a compensating signal and for adding said compensating signal at said second capacitor lead in opposition to the voltage across said first capacitor.

2. The combination according to claim 1 in which said compensating means includes a differential amplifier having its inputs connected across said second capacitor, the output of said amplifier providing said compensating signal.

3. The combination according to claim 2 in which said second capacitor is larger in capacitance value than said first capacitor by a predetermined factor thereby to develop a terminal voltage which is smaller than that developed across said first capacitor as a result a of given pulse current through said voltage divider.

4. The combination according to claim 3 in which said amplifier provides a gain which is substantially equal to the reciprocal of said predetermined factor.

5. The combination according to claim 3 in which said amplifier provides a gain whereby said compensating signal is amplified and inverted.

6. The combination according to claim 1 in which said first capacitor is shunted by a bleeder resistor, the decrease of charge and terminal voltage across said first capacitor providing a larger compensating signal for smaller resulting instantaneous values of said first capacitor voltage.

7. The combination according to claim 2 in which said first capacitor is shunted by a bleeder resistor, the decrease of charge and terminal voltage at said first capacitor resulting in a larger pulse current value through said capacitive divider during the next pulse in said pulse train and generation of a correspondingly larger value of said compensating signal.

8. In a pulse regulating system responsive to a source of a train of pulses and having a first capacitor and a diode connected between said source and a terminal of said first capacitor to provide charging of said first capacitor during each successive pulse of said train to a voltage which is a small fraction of the nominal peak voltage of said pulses, the combination comprising
  first means including a second capacitor connected at one terminal thereof to the other terminal of said first capacitor and circuit means for developing a continuous dynamic compensating signal as a function of the voltage accumulation across said second capacitor;
  and second means responsive to said first means for amplifying, inverting and applying said compensating signal at the other terminal of said second capacitor, thereby to adjust the clipping threshold of said diode.

9. The combination according to claim 8 in which said second means comprises an inverting differential amplifier having one of its inputs connected to each of the two terminals of said second capacitor, the output of said amplifier being connected to said second capacitor other terminal.

10. The combination according to claim 8 in which said first and second capacitors form a capacity divider, said second capacitor having a larger capacitance value by a predetermined factor than that said first capacitor.

11. The combination according to claim 10 in which said differential amplifier provides a gain substantially equal to the reciprocal of said predetermined factor.

12. The combination according to claim 9 further defined in that said first and second capacitors form a capacity divider, said second capacitor having a larger capacitance by a predetermined factor than that of said first capacitor, said second capacitor developing a terminal voltage less than that of said first capacitor by said predetermined factor.

13. The combination according to claim 12 in which said amplifier is defined as providing a gain which is a function of the reciprocal of said predetermined factor.

14. The combination according to claim 8 in which said source of said pulse train has a source impedance sufficient to limit the growth of charge in said capacitors according to a time constant consistent with the nominal time duration of each of said pulse.

* * * * *